United States Patent
Roidt

[11] Patent Number: 6,127,766
[45] Date of Patent: Oct. 3, 2000

[54] PAIRED-TUBE THERMOELECTRIC COUPLE

[75] Inventor: R. Michael Roidt, N. Versailles, Pa.

[73] Assignee: Siemens Westinghouse Power Corporation, Orlando, Fla.

[21] Appl. No.: 09/393,518

[22] Filed: Sep. 10, 1999

Related U.S. Application Data

[63] Continuation-in-part of application No. 09/076,168, May 4, 1998, abandoned.
[51] Int. Cl.[7] .................................................. H02N 3/00
[52] U.S. Cl. .......................... 310/306; 310/306; 136/205; 136/212
[58] Field of Search ................................ 310/306, 307; 136/205, 208, 210, 211, 212

[56] References Cited

U.S. PATENT DOCUMENTS

| | | | |
|---|---|---|---|
| 713,652 | 11/1902 | Kitsee | 136/208 |
| 3,303,057 | 2/1967 | Winckler et al. | 136/208 |
| 3,400,452 | 9/1968 | Emley | 136/208 |
| 3,715,237 | 2/1973 | Walker | 136/89 |
| 3,901,080 | 8/1975 | Hilborn | 73/343 |
| 3,907,606 | 9/1975 | Chang | 136/233 |
| 5,172,979 | 12/1992 | Barkley et al. | 374/147 |
| 5,625,245 | 4/1997 | Bass | 310/306 |

OTHER PUBLICATIONS

Callat, T. et al., "Zn–Sb Alloys for Thermoelectric Power Generation," *IEEE*, 1996, pp. 905–909.

*Primary Examiner*—Nestor Ramirez
*Assistant Examiner*—Karl E. I. Tamai
*Attorney, Agent, or Firm*—Eckert Seamans Cherin & Mellott, LLC

[57] ABSTRACT

A thermionic paired tube bank (100) designed for use as a tubular heat exchanger for generating electricity, preferably heated by combustion products after they leave the combustor of a power plant but before they enter the turbine or steam generator portion of the power generation system. In this case the thermionics act as a topping cycle to increase the overall electrical generation efficiency. The heat could also be supplied by the products of combustion as they leave the gas turbine or steam generator in which case the thermionics would act as a bottoming cycle. The thermionic paired-tube bank comprises a plurality of paired-tube thermoelectric couples (50) and a plurality of electrical connections (66, 68). Each paired-tube thermoelectric couple (50) comprises a first tube comprising n-type semiconductor material and a coolant channel (70) through the first tube, a second tube comprising p-type semiconductor material and a coolant channel (70) through the second tube, and a first electrical connection which connects the first tube and the second tube in parallel relation.

6 Claims, 4 Drawing Sheets

PAIRED-TUBE THERMOELECTRIC COUPLE

CROSS-REFERENCE TO RELATED APPLICATIONS

This application is a continuation-in-part of U.S. patent application Ser. No. 09/076,168 now abandoned, filed on May 4, 1998.

FIELD OF THE INVENTION

The present invention relates generally to thermoelectric couples, and more particularly to a configuration of thermoelectric semiconductor material for use in a shell and tube heat exchanger of a large power generation system to generate additional power from a heat exchanger.

BACKGROUND OF THE INVENTION

A cross-sectional view of a standard thermoelectric couple 10 is shown in FIG. 1. The thermoelectric couple consists of two volumes of semiconductor materials 20 and 30 having dissimilar characteristics, connected electrically in series, and thermally in parallel between a high temperature heat source 14 and a lower temperature heat sink 12. The semiconductor materials are n-type 30 which has more electrons than necessary to complete a perfect molecular lattice and p-type 20 which has an electron deficit or electron vacancies with respect to developing a perfect lattice.

The laws of physics indicate that when such a couple is subjected to a heat flow between the heat source 14 and heat sink 12 an electric potential is developed across the thermoelectric couple. If the couple is connected to an electrical load 16 a current 8 is developed in the direction of the heat flux (or temperature gradient) in the p-type material 20 and in the opposite direction in the n-type material Characteristics of good semiconductor materials include low thermal conductivities so that a large temperature gradient may be maintained between the heat source and sink as well as high electrical conductivities so that there is little impedance to electron flow.

Electrical conductors 26 provide the series connections for conducting the current through the thermoelectric couple and the electrical load. If the heat source and sink are conductive they must be electrically separated from their surroundings or these conductors 26 by electrical insulators 24.

The extra electrons in the n-type material 30 and the vacancies in the p-type material 20 are acted upon by the heat flux between heat source 14 and heat sink 12 to produce the current 8 which is proportional to the heat flux. The heat flux to the heat source may be supplied by the combustion products from a gas turbine combustor before these products enter the turbine to do expansion work in which case the power from the thermoelectric couple would represent topping cycle work for a combined cycle power plant. If the heat flux to the heat sink is absorbed in a boiler which supplies steam to a steam turbine while the heat source gas goes to a gas turbine a doubly topped gas turbine cycle would be possible.

In practical applications to generate electricity thermoelectric couples 10 are combines in a modular assembly 90 where they are connected electrically in series and thermally in parallel as shown in FIG. 2. The temperature difference across the couples 10 forces the current to make the loop through the p-type material 20 toward the cold junction 12, across a conductor 26, back through the n-type material 30 toward the hot junction 14, across another conductor 26 and through the next couple 10 in the same manner. The resulting build up in voltage is proportional to the number of couples 10 in the module 90.

Modules 90 are available in a variety of sizes, shapes, operating currents, operating voltages, number of couples, and ranges of heat-pumping levels. For large power generation systems, however, where a great deal of heat is generated, grouping thousands of couples 10 in modules 90 to generate electricity would be a very costly and impractical procedure. Conventional thermoelectric couples 10 produce a relatively small amount of electricity per unit volume. Consequently, grouping together the large number of couples 10 required to generate electricity in a large power generation system would be quite inefficient because merely arranging the couples 10 in a systematic manner would be rather difficult. It is, therefore, desirable to take advantage of the benefits of semiconductor materials and provide a configuration of a thermoelectric device for use in a shell and tube heat exchanger of a large power generation system to generate electricity. A shell and tube heat exchanger configuration has a very large heat transfer surface to overall volume ratio.

SUMMARY OF THE INVENTION

The invention resides in the embodiment of a standard thermoelectric couple as a pair of tubes, or a paired tube thermoelectric couple, one of which contains n-type semiconductor material and the other of which contains p-type semiconductor material. The thermionic paired tube bank is comprised of a plurality of such paired tube thermoelectric couples and a plurality of (second) electrical connections. Such a geometry allows application of shell and tube heat exchanger design to thermoelectric technology for electrical power generation.

The order in which the pair of tubes are placed relative to one another as well as whether the inside of the tube is heated and the outside cooled or vice-versa, only determines the direction of the electrical current and we will assume, for purposes of illustration, that the first tube will contain n-type semiconductor material, the inside of the tubes will be cooled and heat supplied to the outside. Under these assumptions each paired tube thermoelectric couple is comprised of a first tube containing n-type semiconductor material and a coolant channel through the first tube, a second tube containing p-type semiconductor material and a coolant channel through the second tube, and a first electrical connection which connects the first and second tube in a parallel electrical relation.

The second electrical connections connect one paired-tube thermo-electric couple to another such that the paired-tube thermoelectric couples are connected electrically in series and thermally in parallel. In another embodiment of the tubular heat exchanger, the thermoelectric couples are connected electrically in parallel and thermally in parallel.

The invention also resides in a thermionic paired-tube bank comprising a plurality of electrically connected paired-tube thermoelectric couples, each paired-tube thermoelectric couple which may contact hot exterior gases comprising: (1) a first tube element comprising a n-type semiconductor material coating on an inner conductive tube which inner tube provides an inner electrical connection, where the coating is covered by an outer conductive tube, which outer tube provides an outer electrical connection, said first tube element having a center coolant channel through said inner conductive tube; and (2) a separate second tube element comprising a p-type semiconductor material coating on an inner conductive tube, which inner tube provides an inner electrical connection, where the coating is covered by an outer conductive tube, which outer tube provides an outer electrical connection, said second tube element having a center coolant channel through said inner conductive tube; wherein adjacent tube elements are electrically connected through the inner electrical connection consisting of the inner conductive tube connection of each first and second tube element and the outer electrical connection consisting of the outer conductive tube connection of each first and second tube element; said paired-tube bank further comprising additional electrical connections which connect one paired-tube thermoelectric couple to another such that said paired-tube thermoelectric couples are connected electrically and thermally.

The invention further resides in a tubular heat exchanger for generating electricity comprising a thermionic paired-tube bank comprising a plurality of paired-tube thermoelectric couples, each paired-tube thermoelectric couple which may contact hot exterior gases comprising: (1) a first tube element comprising a n-type semiconductor material coating on an inner conductive tube, which inner tube provides an inner electrical connection, where the coating is covered by an outer conductive tube, which outer tube provides an outer electrical connection, said first tube element having a center coolant channel through said inner conductive tube; and (2) a separate second tube element comprising a p-type semiconductor material coating on an inner conductive tube which inner tube provides an inner electrical connection, where the coating is covered by an outer conductive tube, which outer tube provides an outer electrical connection, said second tube element having a center coolant channel through said inner conductive tube; wherein the inner electrical connection consisting of the inner conductive tube connection of each first and second tube element and the outer electrical connection consisting of the outer conductive tube connection of each first and second tube element, connects adjacent tube elements; said paired-tube bank further comprising a plurality of second electrical connections which connect one paired-tube thermoelectric couple to another such that said paired-tube thermoelectric couples are connected electrically and thermally, where the tubular heat exchanger generates electricity from heat produced by a power generation system, and where the inner and outer electrical connections are effective to allow a continuous current to flow through the semiconductor materials of the first and second tube elements and heat to flow through the couples, from any contacting exterior gases, where current flow is in the direction of heat flow through the p-type semiconductor material and current flow is in the opposite direction of heat flow through the n-type semiconductor material, and where the conductive tubes are metal tubes.

Although each paired tube thermoelectric couple has, in this illustration, a heat flux from the outside to the inside of each tube the unique properties of the two semiconductor materials allow a series electrical collection as follows: The current flows against the heat flux in n-type material so that it flows from the conducting layer on the inside of the first tube through the n-type material, to the conducting layer on the outside of the tube. This outer conducting layer is connected to the conducting outer layer of the second of the tube pair which contains the p-type material layer. The current generated in the p-type material flows inwardly in the same direction as the heat flux and is collected on the inner conducting layer from which it may be passed to the inner conducting layer of the n-type tube of the next paired thermoelectric couple.

In preferred embodiments of the present invention, the tubular heat exchanger generates electricity from heat produced by a power generation system. In other preferred embodiments of the tubular heat exchanger, the heat exchanger further comprises a shell wherein the paired-tube thermoelectric couples are situated, the shell comprising electrical insulators, and two electrical buses serving as the points of varying electric potential, whereby the electrical insulators serve to keep the shell from interfering with the electrical conductivity of the paired-tube thermoelectric couples.

DETAILED DESCRIPTION OF THE PREFERRED EMBODIMENTS

Figure 1:
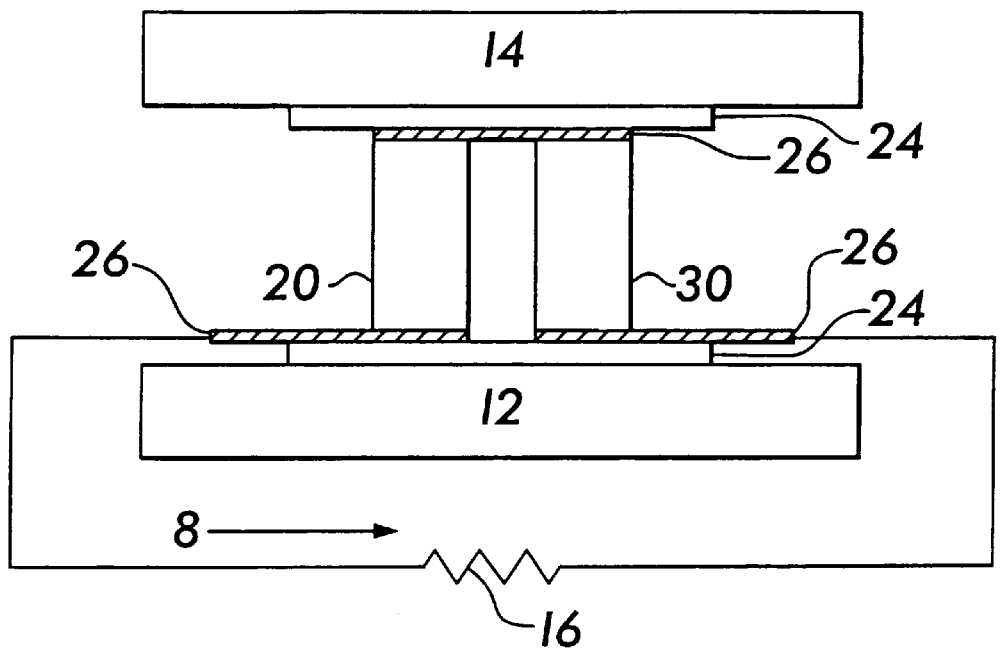
FIG. 1 is a cross-sectional view of a standard thermoelectric couple.
Figure 2:
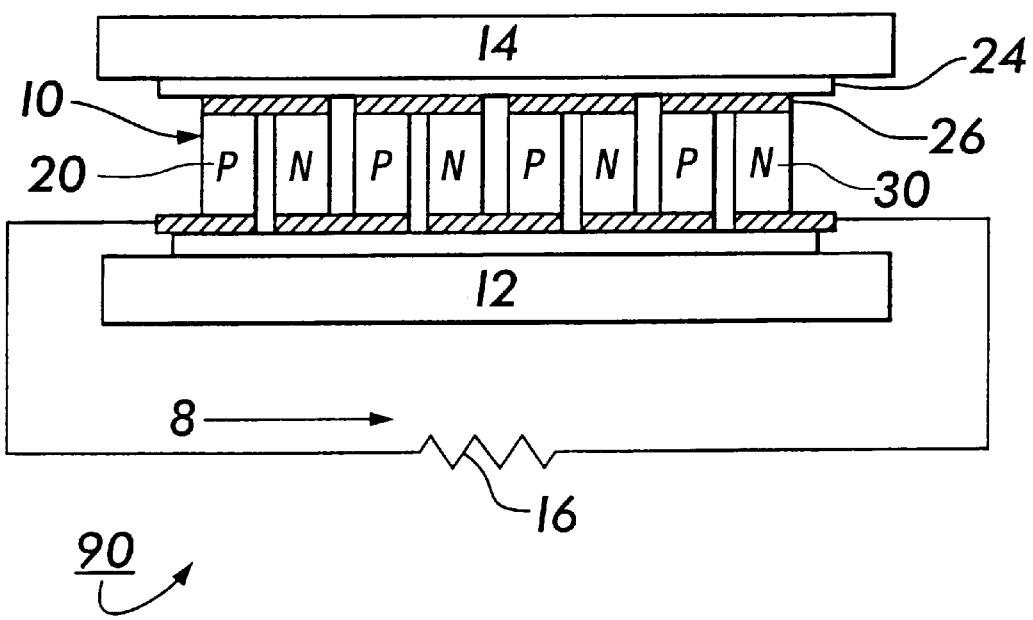
FIG. 2 is a cross-sectional view of a module assembly of thermoelectric couples.
Figure 3:
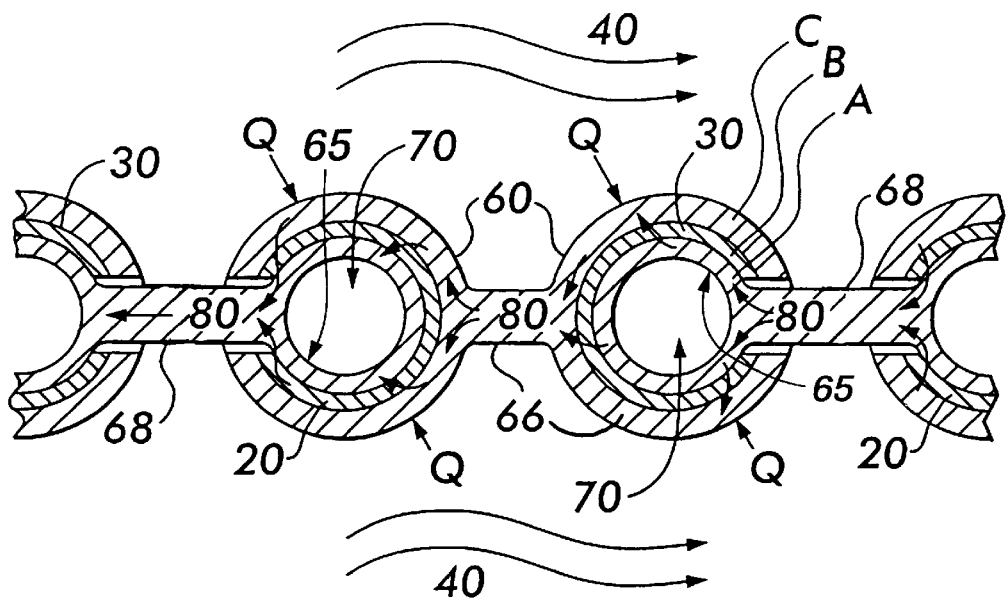
FIG. 3 is a cross-sectional view of a paired-tube thermoelectric couple according to the present invention.

Referring to the drawings, there is shown in FIG. 3 a cross-sectional view of a paired-tube thermoelectric couple 50 according to the present invention. The function of the paired-tube thermoelectric couple 50 is to utilize semiconductor materials to provide a thermoelectric device for use in a shell and tube heat exchanger of a large power generation system. This configuration is intended to replace the traditional modular assembly 90 of thermoelectric couples 10 of FIG. 2 in the configuration of a shell and tube heat exchanger.

Figure 4:
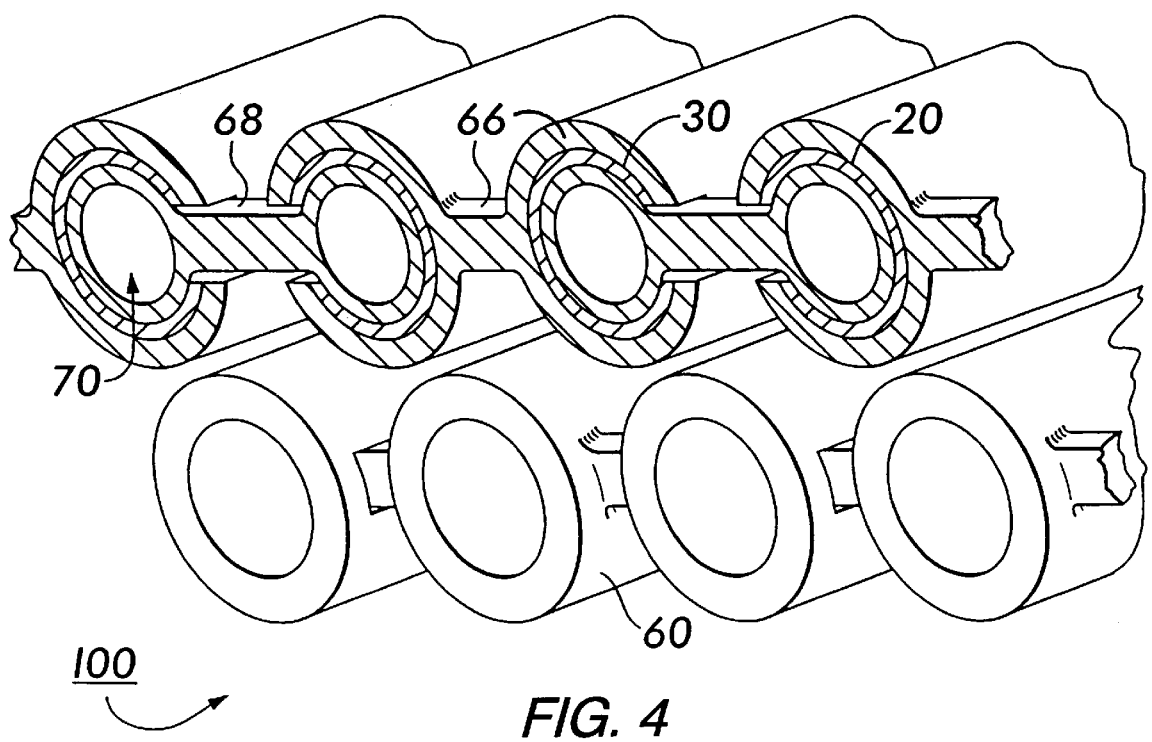
FIG. 4 is an isometric view of a thermionic paired-tube bank according to the present invention.

The paired-tube thermoelectric couple 50 comprises a plurality of metallic tubes 60, one coated on the inside with n-type semiconductor material 30 and one coated on the inside with p-type semiconductor material 20. Each of these tubes then has an inner layer of conducting material 65 on the inside of the semiconductor layer. The current flows and other relationships are shown in the pair of coated tubes in the center of FIG. 3. The two central tubes of FIG. 3 represent a paired-tube thermoelectric couple. Examples of state-of-the-art n-type and p-type thermoelectric alloys include $Bi_2Te_3$-based compositions or PbTe-based compositions. The coating procedure may include electrochemical deposition or electro-vapor deposition techniques. Alternatively, the semiconductor material may be extruded on the tubes 60 in some form of high temperature extrusion process. The tubes 60 each contain coolant channels 70 in the center or inside of each tube 60 and the tubes 60 are electrically coupled by means of electrical connections 66 and 68. Connection 66 connects the central tubes of FIG. 3 with the left side tube and connection 68 connects the central tube with the right side tube and left side tube, as shown. The tubes 60 of a thermoelectric couple 50 are connected by an outer electrical connection 66 and the thermoelectric couples 50 are connected to adjacent thermoelectric couples 50 by a set of inner electrical connections 68, as best shown in FIG. 4. "Outer" connections 66 means surrounding the entire outer surface of the thermoelectric alloy and disposed away from coolant conduits 70 as shown, and "inner" connections 68 means between tubes and also within tubes and next to coolant channel 70. Each connection 66 and 68 are separated by the thermoelectric alloy.

Hot air, gas or fluid 40 flows around the outside of the tubes 60, preferably across the tubes 60, and the direction of the heat Q flows from the outside radially inward toward the coolant channels 70 where coolant flows longitudinally down the tubes 60. Simultaneously, current 80 flows through the outer electrical connections 66 from tube 60 to tube 60, in the direction of the heat Q flow with the tubes 60 coated with p-type material 20 and opposite the direction of heat Q flow with the tubes 60 coated with n-type material 30. The right central tube in FIG. 3 has a coating of n-type thermoelectric material 30, where current 80 (the arrows) pass out (away) from coolant channel 70, while in the left central tube, which contains a p-type thermoelectric material, the current (arrows) passes toward the cooling channel 70. In this manner, the current 80 and voltage builds up in each paired-tube thermoelectric couple 50.

The electrical connections 66 and 68 allow a continuous current 80 to flow through the semiconductor materials 20 and 30 from one couple 50 to another couple 50. Each tube 60 comprises a three layer composite. The inner, first layer A of each tube 60 is composed of a conductive material, preferably metal, which is coated with the second layer B, that of semiconductor material 20 or 30. The paired-tubes of each thermoelectric couple 50 are electrically connected (through outer electrical connections 66) to each other by the third layer C, which is also composed of a conductive material, preferably metal. The inner layer A electrically connects (through inner electrical connections 68) each couple 50 to adjacent couples 50. Accordingly, current 80 flows through the semiconductor materials 20 and 30 from one couple 50 to another couple 50, following the conductive path from a first layer A to a third layer C, and then back to a first layer A and so on, as illustrated in the left and central tubes shown in FIG. 3 (following the arrows—current 80 from the central tube to the left hand tube).

As shown in FIG. 3, the right central tube composite comprising layers A, B and C has two adjacent (right and left) tube composites, where, in couple 50, the inner conductive tube connection A of the central tube in couple 50 electrically connects to an adjacent tube (central tube to right tube) and the outer conductive tube connection C of the central tube in couple 50 electrically connects to an adjacent tube (central tube to left tube). Elements 66 is a continuation of C and 68 is a continuation of A.

In operation in a shell and tube heat exchanger, multiple paired-tube thermoelectric couples 50 are electrically connected in a thermionic paired-tube bank 100, as shown in FIG. 4. Each row of connected tubes shown in FIG. 4 are multiple paired couples 50. As with the conventional module assembly 90, the tubes 60 are connected electrically in series and thermally in parallel. In each row in FIG. 4 heat (Q in FIG. 3) flows into coolant channels 70 and coolant flowing in the channels absorbs such heat, where coolant all flows longitudinally in the same direction within each channel. With such a configuration, the same effect as that achieved with the traditional module assembly 90 can be achieved.

Preferably, semiconductor materials having a figure of merit, Z, of approximately 0.02 (C)$^{-1}$ are desired, where $$Z = \frac{S^2}{PK}$$

and S is the Seebeck coefficient measured in V/° C., P is electrical resistivity measured in $\Omega$/cm$^3$, and K is thermal conductivity measured in W/(° C.)(cm$^3$).

Recently, Zn-Sb alloys have been identified as a new high performance p-type thermoelectric material. In particular, B-Zn$_4$Sb$_3$ materials have been found to have a maximum dimensionless thermoelectric figure of merit, ZT, of approximately 1.3 at a temperature range of about 400° C. Thermoelectric materials with large ZT values are desired for use in the present invention and denote a combination of very low thermal conductivity and good electrical conductivity.

Figure 5:
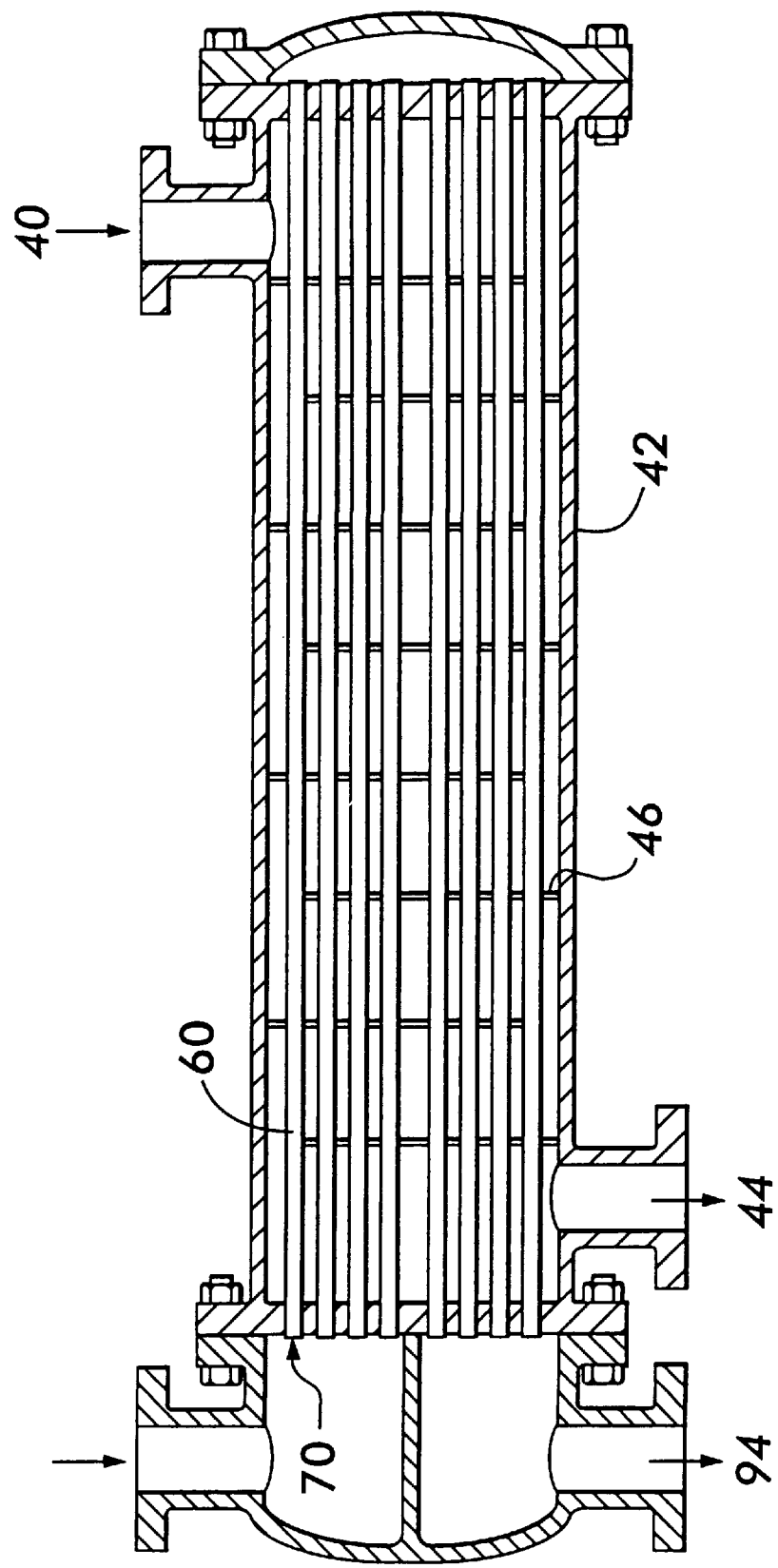
FIG. 5 is a cross-sectional view of paired-tube thermoelectric couples in the configuration of a shell and tube heat exchanger according to the present invention.

FIG. 5 shows a cross-sectional view of paired tube thermoelectric couples 50 in the configuration of a shell and tube heat exchanger according to the present invention. Hot gas or fluid 40 enters the shell 42, is directed through the shell 42 by means of the baffles 46 and flows around the tubes 60. Simultaneously, coolant enters the shell 42 and flows through the coolant channels 70. Heat is transferred from the hot gas 40 to the coolant to generate electricity, while warmer coolant 94 and cooler hot gas 44 exit the shell 42.

Figure 6:
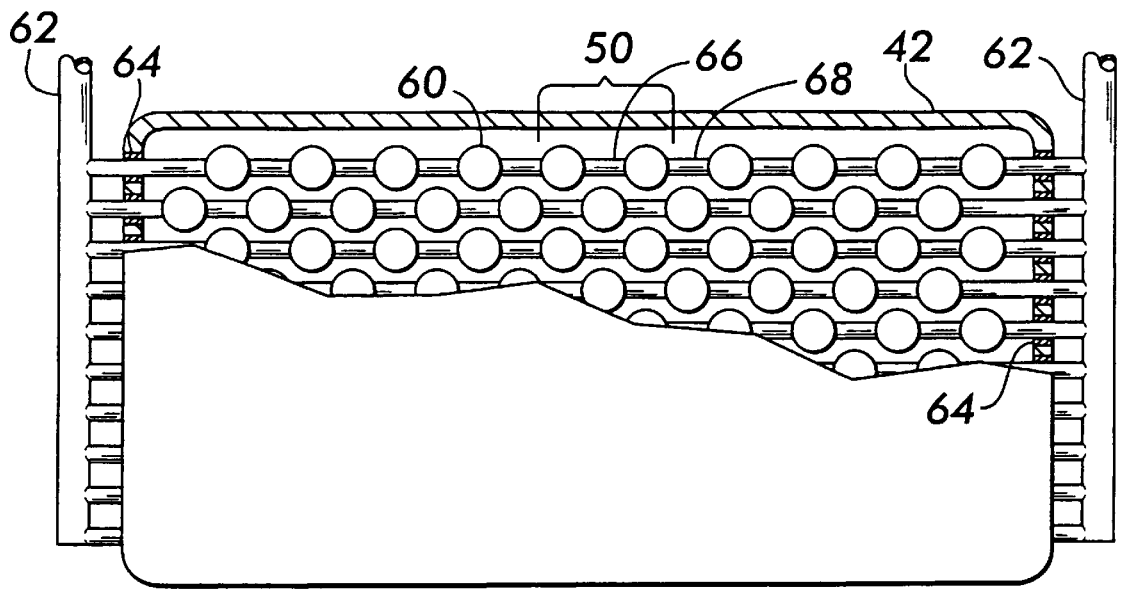
FIG. 6 is a cross-sectional, longitudinal view of paired-tube thermoelectric couples arranged in a parallel configuration in a shell and tube heat exchanger according to the present invention.

FIG. 6 shows a cross-sectional, longitudinal view of paired-tube thermoelectric couples 50 arranged in a parallel configuration in a shell and tube heat exchanger according to the present invention. In parallel configuration, relatively high current is generated. The rows of tubes 60 are connected in parallel and at each end to an electrical bus 62, which together serve as the points of varying electric potential. The parallel configuration also utilizes insulation sleeves 64, situated between the rows of tubes 60 and each electrical bus 62 so that the conductive shell 42 does not interfere with the conductivity of the electric circuit.

Figure 7:
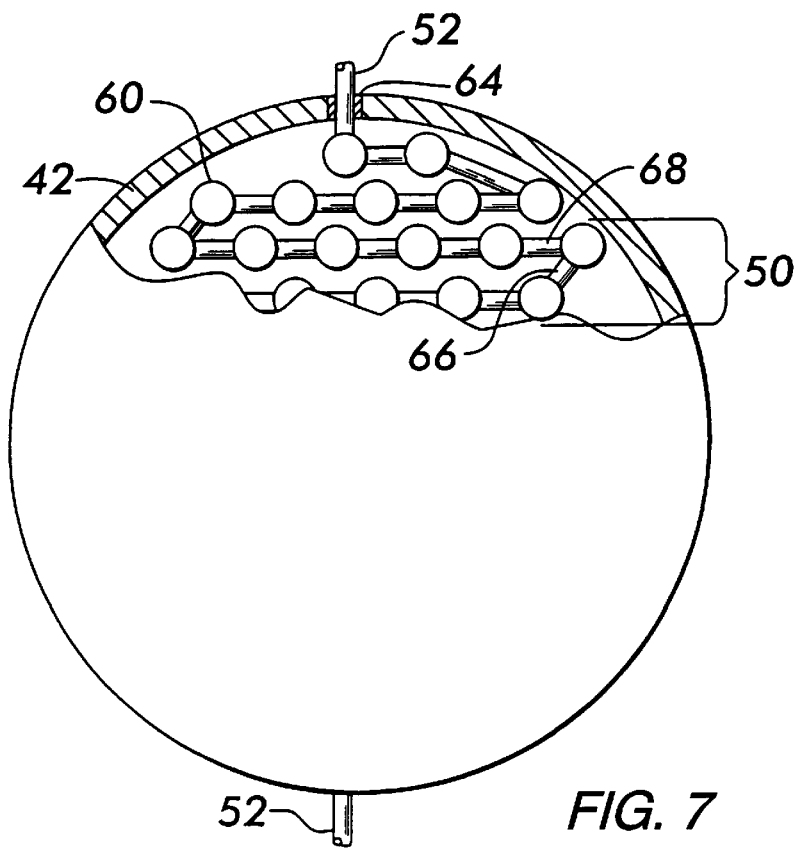
FIG. 7 is a cross-sectional, longitudinal view of paired-tube thermoelectric couples arranged in series in a shell and tube heat exchanger according to the present invention.

FIG. 7 shows a cross-sectional, longitudinal view of paired-tube thermoelectric couples 50 arranged in series in a shell and tube heat exchanger according to the present invention. In a series configuration, relatively high voltage is generated. The tubes 60 are connected to each other in series and the end tubes are electrically connected by means of connections 52 to electrical buses, which together serve as the points of varying electric potential. The series configuration also utilizes insulation sleeves 64, situated between the tubes 60 and each electrical bus so that the conductive shell 42 does not interfere with the conductivity of the electric circuit.

An alternate embodiment of the paired-tube bank 100 of the present invention has the hot air, gas or liquid flowing through the center or inside of the tubes 60 while the coolant 90 flows around the outside of the tubes 60. This configuration is an alternate design of a shell and tube heat exchanger and similarly would work just as well with the present invention.

It is to be understood that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A thermionic paired-tube bank comprising a plurality of electrically connected paired-tube thermoelectric couples, each paired-tube thermoelectric couple which may contact hot exterior gases comprising:

(1) a first tube element comprising a n-type semiconductor material coating on an inner conductive tube which inner tube provides an inner electrical connection, where the coating is covered by an outer conductive tube, which outer tube provides an outer electrical connection surrounding the entire outer surface of the semiconductor material coating, said first tube element having a center coolant channel through said inner conductive tube; and (2) a separate second tube element comprising a p-type semiconductor material coating on an inner conductive tube, which inner tube provides an inner electrical connection, where the coating is covered by an outer conductive tube, which outer tube provides an outer electrical connection surrounding the entire outer surface of the semiconductor material coating, said second tube element having a center coolant channel through said inner conductive tube; and wherein adjacent tube elements are electrically connected through the inner electrical connections or the outer electrical connections; where the inner and outer electrical connections are effective to allow a continuous current to flow through the semiconductor materials of the first and second tube elements and heat to flow through the couples, from any contacting exterior gases, where current flow is in the direction of heat flow through the p-type semiconductor material and current flow is in the opposite direction of heat flow through the n-type semiconductor material, said paired-tube bank further comprising additional electrical connections which connect one paired-tube thermoelectric couple to another, where the paired-tube thermoelectric couples are parallel to each other, and where second tube element is electrically connected to first tube element through the outer electrical connection of the second tube element, and the first tube element is electrically connected to an adjacent tube element which is not the second tube element through the inner electrical connection of the first tube element.

2. The thermionic paired-tube bank of claim 1, where the conductive tubes are metal tubes.

3. The thermionic paired-tube bank of claim 1, where, within each paired tube thermoelectric couple, current can pass into the inner conductive tube of the second tube element, pass through the n-type semiconductor material, pass into the outer conductive tube of the second tube element and then pass into the outer conductive tube of the first tube element, pass through the p-type semiconductor material and then pass into the inner conductive tube of the first tube element.

4. A tubular heat exchanger for generating electricity comprising a thermionic paired-tube bank comprising a plurality of paired-tube thermoelectric couples, each paired-tube thermoelectric couple which may contact hot exterior gases comprising:

(1) a first tube element comprising a n-type semiconductor material coating on an inner conductive tube, which inner tube provides an inner electrical connection, where the coating is covered by an outer conductive tube surrounding the entire outer surface of the semiconductor material coating, which outer tube provides an outer electrical connection, said first tube element having a center coolant channel through said inner conductive tube; and (2) a separate second tube element comprising a p-type semiconductor material coating on an inner conductive tube which inner tube provides an inner electrical connection, where the coating is covered by an outer conductive tube, which outer tube provides an outer electrical connection surrounding the entire outer surface of the semiconductor material coating, said second tube element having a center coolant channel through said inner conductive tube; wherein the inner electrical connections or the outer electrical connections, connect adjacent tube elements; said paired-tube bank further comprising a plurality of second electrical connections which connect one paired-tube thermoelectric couple to another such that said paired-tube thermoelectric couples are connected electrically and where the tubular heat exchanger generates electricity from heat produced by a power generation system, and where the inner and outer electrical connections are effective to allow a continuous current to flow through the semiconductor materials of the first and second tube elements and heat to flow through the couples, from any contacting exterior gases, where current flow is in the direction of heat flow through the p-type semiconductor material and current flow is in the opposite direction of heat flow through the n-type semiconductor material, where the paired-tube thermoelectric couples are parallel to each other, and where second tube element is electrically connected to first tube element through the outer electrical connection of the second tube element, and the first tube element is electrically connected to an adjacent tube element which is not the second tube element through the inner electrical connection of the first tube element.

5. The tubular heat exchanger of claim 4, where the conductive tubes are metal tubes.

6. The tubular heat exchanger of claim 4, where, within each paired-tube thermoelectric couple, current can pass into the inner conductive tube of the second tube element, pass through the n-type semiconductor material, pass into the outer conductive tube of the second tube element and then pass into the outer conductive tube of the first tube element, pass through the p-type semiconductor material and then pass into the inner conductive tube of the first tube element.

* * * * *